United States Patent [19]

Koizumi et al.

[11] Patent Number: 4,704,348
[45] Date of Patent: Nov. 3, 1987

[54] EXPOSURE OF UNIFORM FINE PATTERN ON PHOTORESIST

[75] Inventors: Yasuhiro Koizumi, Sayama; Soichi Torisawa, Tokyo, both of Japan; Walter Gärtner, Jena, German Democratic Rep.; Gudrun Dietz, Jena-Lobeda, German Democratic Rep.; Wolfgang Retschke, Jena, German Democratic Rep.

[73] Assignees: Hitachi, Ltd., Tokyo, Japan; Veb Carl Zeiss Jena. DDR., Jena, German Democratic Rep.

[21] Appl. No.: 779,832

[22] Filed: Sep. 25, 1985

Related U.S. Application Data

[63] Continuation of Ser. No. 368,652, Apr. 15, 1982, abandoned.

[30] Foreign Application Priority Data

Apr. 24, 1981 [DE] Fed. Rep. of Germany ... 2B2294753
Sep. 30, 1981 [JP] Japan .............................. 56-154059

[51] Int. Cl.$^4$ .............................................. G03C 5/00
[52] U.S. Cl. ..................................... 430/327; 430/30; 430/311; 430/394; 355/30; 355/53
[58] Field of Search ................. 430/30, 327, 494, 311, 430/394; 355/30, 53, 55

[56] References Cited

U.S. PATENT DOCUMENTS 3,620,621 11/1971 Rachwal et al. ...................... 355/30
4,026,653 5/1977 Appelbaum et al. ............... 355/132
4,423,137 12/1983 Rester ................................. 430/320

FOREIGN PATENT DOCUMENTS

WO79/00340 6/1979 PCT Int'l Appl. .

OTHER PUBLICATIONS

Pacansky et al., "Photochemical Decomposition Mechanisms For AZ Type Photoresist," IBM J. Res. Develop vol. 23 (1) Jan. 1979, pp. 42–55.

Primary Examiner—John E. Kittle
Assistant Examiner—José G. Dees
Attorney, Agent, or Firm—Antonelli, Terry & Wands

[57] ABSTRACT

Exposure of fine patterns on a photoresist is carried out by controlling the humidity and temperature of a gas to be supplied to an exposure apparatus separate from the ambient atmosphere.

Temperature of the atmosphere at least in the vicinity of a photoresist is controlled in a predetermined range and air or gas to be supplied to the exposure space is humidified to a desired degree.

Water content in the photoresist is kept uniform and constant by the specially controlled atmosphere and enables uniform pattern width of the exposed fine pattern all over the photoresist surface.

22 Claims, 11 Drawing Figures

EXPOSURE OF UNIFORM FINE PATTERN ON PHOTORESIST

This is a continuation of application Ser. No. 368,652, filed Apr. 15, 1982, abandoned.

This invention relates to a method and apparatus for optically copying an original pattern or picture onto a workpiece coated with photoresist and particularly to a method and apparatus capable of decreasing the local nonuniformity of the transferred pattern.

In manufacturing semiconductor devices, it is often required to project a mask pattern onto a photoresist layer coated on a workpiece such as a wafer for forming a photoresist mask pattern on the wafer surface. Similar projection process is required when making a so-called working photomask from a master reticle. The photoresist is known to exhibit a large difference in solubility between exposed and nonexposed portions by the photochemical effect of radiation energy, in an inorganic or organic developer. Therefore, development will leave a negative or positive photoresist mask corresponding to the distribution of light energy on a workpiece such as a wafer. From this point of view, it can be considered that uniform transfer of pattern free of local nonuniformity or unevenness can be obtained as long as the photoresist is exposed under uniform illumination.

However, when a photoresist mask is practically formed on a workpiece using this kind of method, local nonuniformity in the pattern width or size in and among photoresist masks results.

Figure 1:
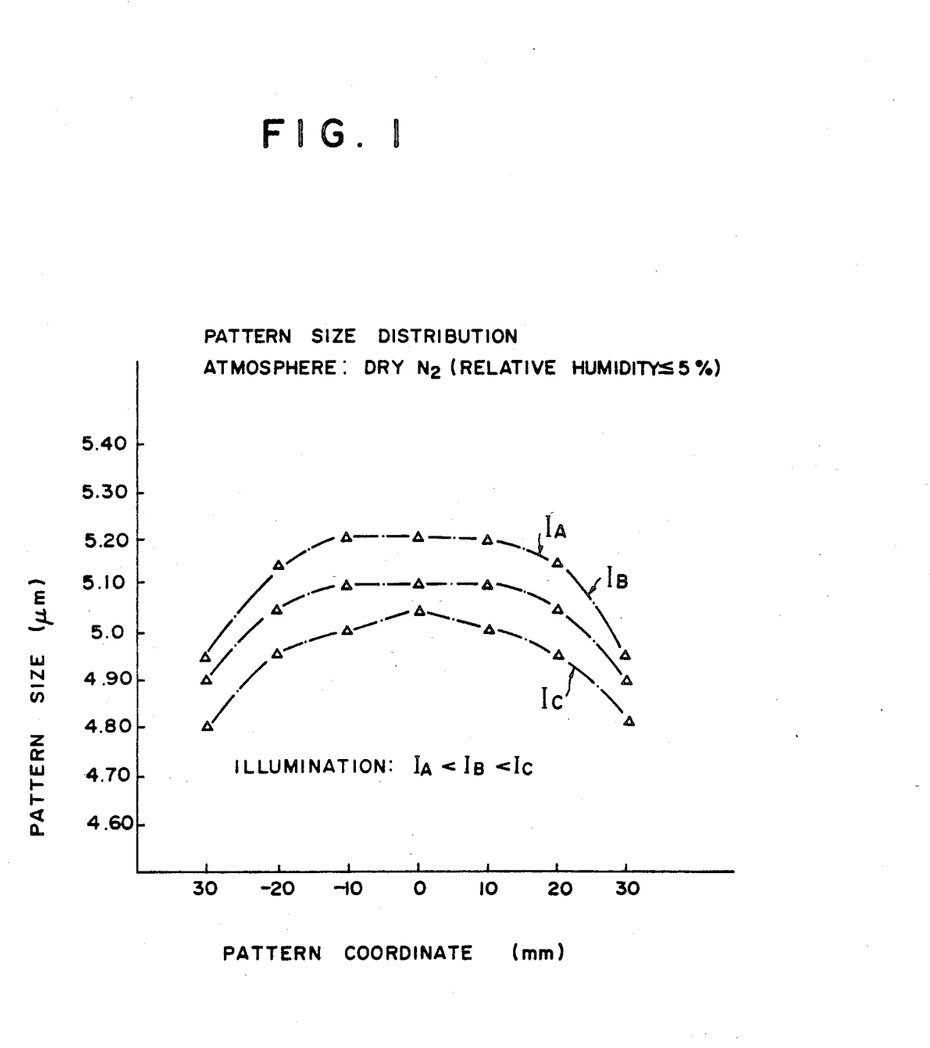
FIG. 1 is a graph showing the distribution of pattern size obtained in a conventional device.

FIG. 1 shows an example of the distribution of a pattern width under three illumination conditions, $I_A < I_B < I_C$, in each of which a plurality of patterns are projected successively onto a photoresist surface coated on a wafer by a step-and-repeat camera. Transferred pattern size clearly depends on the intensity of light as expected and seen from the figure. Further, there are variations in the pattern size or width between the center and the periphery of each photoresist mask, although the successive patterns are exposed by the same amount of light energy.

The present inventors carried out experiments to investigate the reason of the latter nonuniformity. It has been found as a result of the experiments that the unevenness of the pattern size is particularly noticeable in masks exposed in those exposing devices in which air is directly or indirectly applied to photoresist films, such as those using an air micrometer for adjusting focus and those using air for transferring workpieces. This may be ascribed to the following reasons.

In the photochemical conversion process of the photoresist, the water content in a photoresist, when the light energy acts upon the photoresist, is estimated to give a large influence on the pattern width, i.e., the photosensitivity of the photoresist. It is noted that air conditioning is normally performed to regulate the humidity and the temperature of air in the exposing room during the exposure of the photoresist, for example in such ranges of $20 \pm 5\%$ and $18 \pm 3°$ C., respectively. These ranges of fluctuation, however, are considered relatively large for the exposure of photoresists. Further, the air for an air micrometer and for an air transferring device is usually supplied from a pressurized gas vessel and is allowed to impinge the photoresist surface and produce variations in water content in the photoresist, which variations in turn produce nonuniform distribution of the photosensitivity over the photoresist surface.

As a result, the pattern width becomes nonuniform for different locations. In the case of a step-and-repeat camera equipped with an air micrometer as used in the experiment of FIG. 1, the amount of air blowing onto the center of the workpiece is larger than that blowing onto the periphery during the process of exposure. For the positive type photoresist, this causes a larger decrease in the water content in and hence a larger decrease in the photosensitivity of the photoresist at the central portion than at the periphery, which will result in the width of the photoresist pattern (unexposed portion) being greater at the central portion than at the periphery. On the other hand, when air is used in the air micrometer for the negative type photoresist, the negative type photoresist film is chemically reacted by the oxygen, etc. contained in the air and is subjected to a decrease in the film thickness. Therefore, it is recommended that inert gases such as $N_2$ gas should be used in the air micrometer for the negative type photoresist to prevent chemical reaction in the photoresist film.

Thereore, an object of this invention is to provide a method of exposing a photoresist in which the photoresist is brought into contact with a gas set to a predetermined humidity separately from the ambient atmosphere to make the water content in the photoresist uniform at least over the surface while being exposed. The original pattern is accurately projected and transferred to the photoresist coated on the surface of a workpiece due to regulated water content in the photoresist.

Another object of this invention is to provide an apparatus for exposing a photoresist comprising a humidity regulator in a gas supply section separate of a temperature and humidity control equipment for the ambient atmosphere so that the gas blowing to the photoresist can be kept to a predetermined humidity.

The above and other objects, features and advantages of this invention will become more apparent in the following detailed description made in conjunction with the accompanying drawings, in which.

Figure 2:
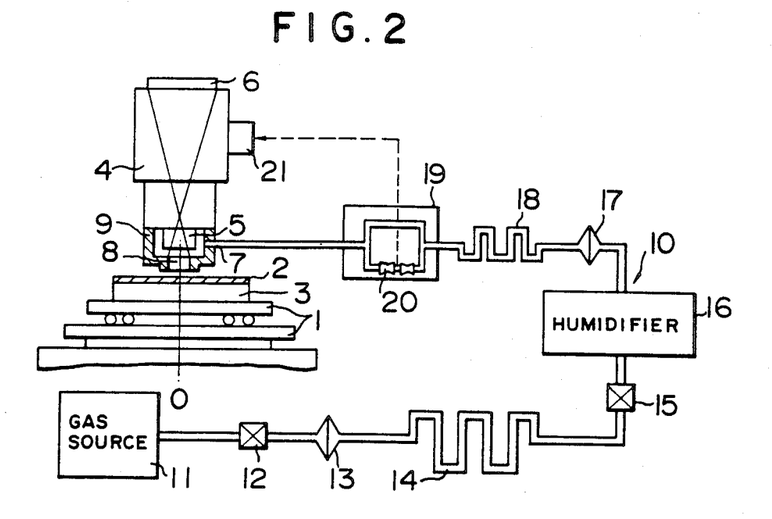
FIG. 2 is a schematic diagram showing a reduction exposure device according to an embodiment of this invention.
Figure 3:
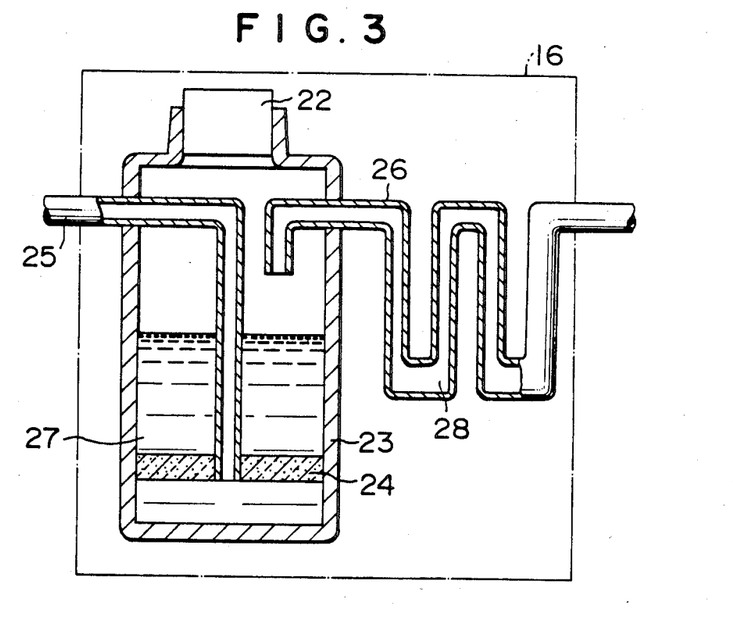
FIG. 3 is an enlarged cross-sectional view of a humidifier used in the device of FIG. 2.

FIG. 2 shows a projecting type reduction exposure device, which is a preferred embodiment of this invention. The device, at least in the main part, is installed in an air-conditioned clean room. Description will be made first on the construction of this embodiment and then on its performance in conjunction with an embodiment of the exposing method of this invention. In this figure, reference numeral 1 denotes an XY table capable of moving along the horizontal direction and the direction perpendicular to the plane of the sheet in the drawing. On this table is mounted a workpiece (silicon wafer) 3 coated on its surface with a film of photoresist 2. Placed above the XY table 1 is a vertically movable barrel 4 which is provided with, at a lower portion, an objective lens 5 with an optic axis 0 and, at a top portion, a mask 6 having a mask pattern to be transferred onto the photoresist surface. The mask pattern on the mask 6 is reduced in size by the objective lens 5 and is projected and transferred onto the photoresist 2 in the step-and-repeat fashion by stepping action of the XY table 1. The objective lens 5 is contained in a casing 9 which is mounted on the barrel 4 and has an inlet opening 7 and an outlet opening (metering nozzle) 8. The inlet opening 7 is connected to a N2 gas source 11 through a piping system 10 thereby to introduce N2 gas into the casing 9, while the outlet opening 8 injects the gas onto the surface of the photoresist 2. The piping system 10 includes, from the upstream to the downstream, a first pressure reducer (valve) 12, a pre-filter 13, a first heat exchanger 14, a second pressure reducer 15, a humidifier 16, a fine filter 17, a second heat exchanger 18 and an air pressure type focusing device 19. The air pressure type forcusing device 19 has a pressure difference detecting portion 20 which compares the N2 gas pressure in the casing 9 with the reference gas pressure supplied from the second heat exchanger 18, and a focus control portion 21 which controls the vertical movement mechanism (not shown) of the barrel 4 according to the pressure difference detected. By comparing the pressures, the device detects the distance, e.g. of micron order, between the objective lens 5 and the photoresist 2 and, according to the pressure difference, controls the vertical position of the barrel 4 to adjust the focus of the lens. The humidifier 16, as shown in FIG. 3, has a porous glass layer 24 permeable to liquid and gas, placed near the internal bottom of the container 23 which is plugged by a stopper 22. The humidifier 16 also has an inlet delivery pipe 25 passing through the porous glass layer 24 and an outlet pipe 26 connected to the upper space in the container 23. Deionized water 27 is contained in the container 23 to a level higher than the porous glass layer 24 but below the drawout pipe 26. The $N_2$ gas supplied through the delivery pipe 25 into the humidifier 16 bubbles up through the water 27 and porous glass layer 24 to the upper space in the container 23 from which it is sent into the drawout pipe 26. While the gas moves up through the water as bubbles, it is humidified. The moistened gas is removed of droplets when passing through the trap 28 formed bent immediately downstream of the drawout pipe 26 and then supplied to the fine filter 17. The deionized water is resupplied through the upper opening by removing the stopper 22.

Now, description will be made on the exposing method using the exposing apparatus of the above construction.

The $N_2$ gas source 11 supplies $N_2$ gas of a relative humidity of 5% under the gage pressure of several atm. The gas is reduced in pressure by the first pressure reducer 12 to about 1.5 atm and is removed of dust or impurity particles by the pre-filter 13. The first heat exchanger 14 performs a preliminary adjustment on the gas temperature to set the $N_2$ gas temperature to, for example, 20° C., about 5° C. lower than the temperature of the atmosphere in the space between the objective lens 5 and the photoresist 2. After this, the $N_2$ gas is further reduced in gage pressure to 1 atm by the second pressure reducer 15 and enters the humidifier 16 where it is humidified as described earlier. Setting the gas temperature and water temperature at appropriate values, the $N_2$ gas absorbs a desired amount of water vapor through the bubbling to have a predetermined humidity. The humidified gas, after being filtered by a fine filter 17, is sent to a second heat exchanger 18 where its temperature is made equal to the temperature in the space between the photoresist 2 and the objective lens 5 with an accuracy of ±0.1° C. and is kept thereat. The humidifier 16 and the second heat exchanger 18 together perform the function of keeping the gas at the specified relative humidity. For instance, where the temperature is 23° C. and the atmospheric pressure is 760 mmHg, the relative humidity to which the N2 gas is kept is about 35%. It will be apparent that the humidifier 16 may precisely be temperature-controlled to enhance the control of humidity and temperature of the $N_2$ gas, but not necessarily. The $N_2$ gas thus humidified and temperature-adjusted, is then sent to the air pressure type focusing device 19 which acts at the average measuring gage pressure of 0.3 atm. From the focusing device 19, the gas is sent through the inlet port 7 of the casing 9 into the working space between the objective lens and the photoresist and surrounded by the casing 9. As a result, this space is filled with the gas of predetermined humidity, thereby keeping the water content in the photoresist constant.

Next, in this condition, the vertical position of the objective lens 5 is controlled by the air pressure type focusing device 19 based on the pressure difference between the pressure in the working space and the standard pressure supplied from the gas source (e.g. second heat exchanger), to project the mask pattern of the mask 6 onto the surface of photoresist 2. By operating the XY table 1 in an appropriate way and projecting and transferring the mask pattern, a plurality of reduced mask patterns can be arranged orderly in lines on the photoresist surface.

Figure 4:
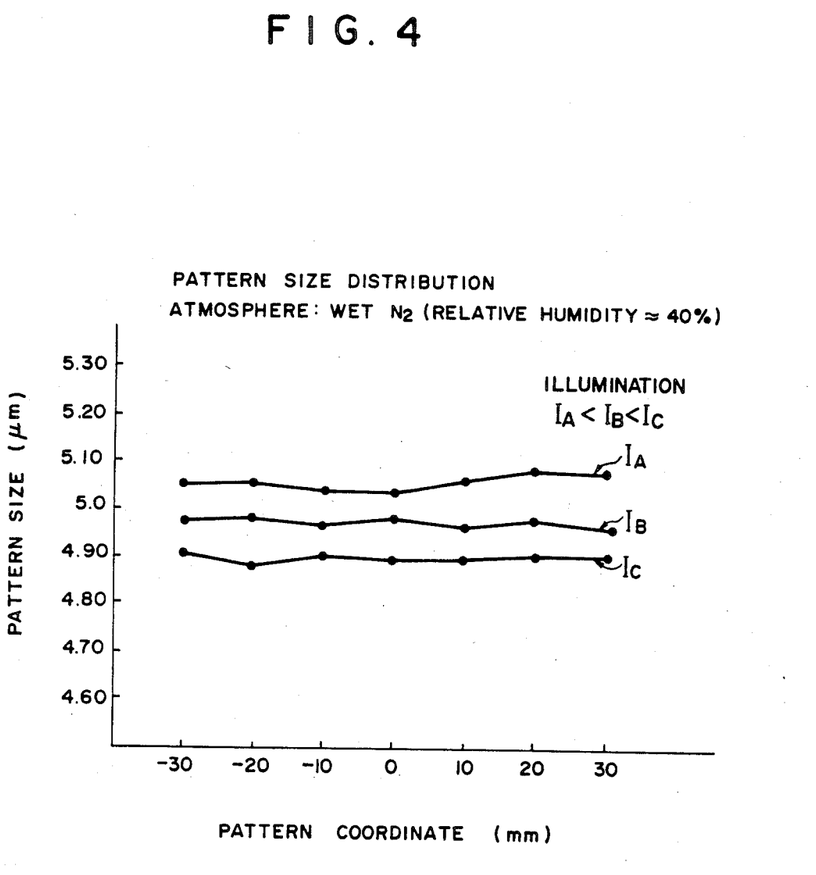
FIGS. 4, 5 and 6A to 6C are graphs showing the results of measurement of photosensitivity and pattern size showing the effects of an embodiment of this invention.
Figure 5:
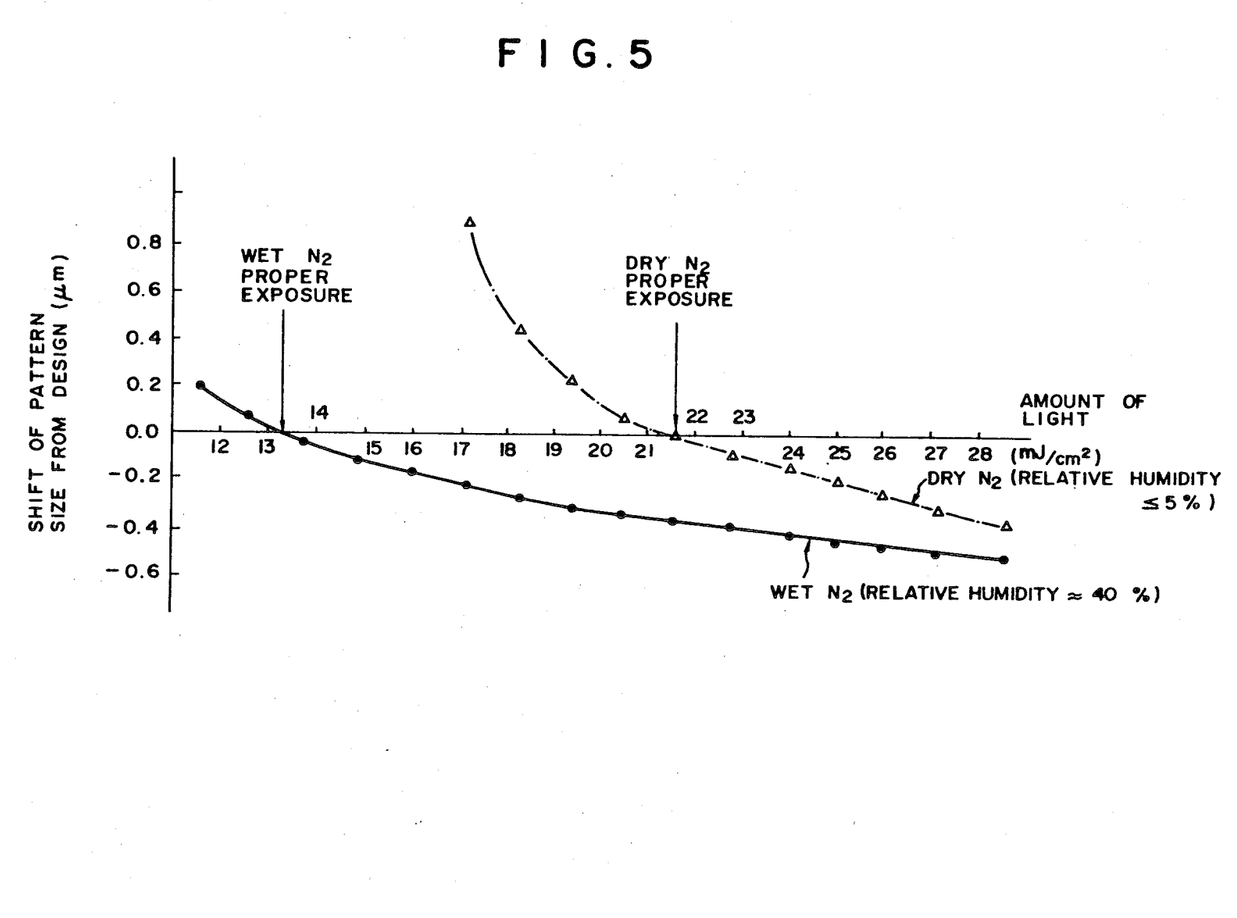

As the result of the exposing process described above, the pattern formed on the workpiece after chemical treatment has almost constant width, as shown in FIG. 4, regardless of whether it is located at the center or the periphery of the workpiece and unevenness in the pattern width is negligible. Comparison between the proper exposing condition, or the photosensitivity of photoresist, of the above method and that of the conventional method as shown in FIG. 5 reveals that the photosensitivity obtained in this method is about two times greater than that of the conventional method.

Figure 6A:
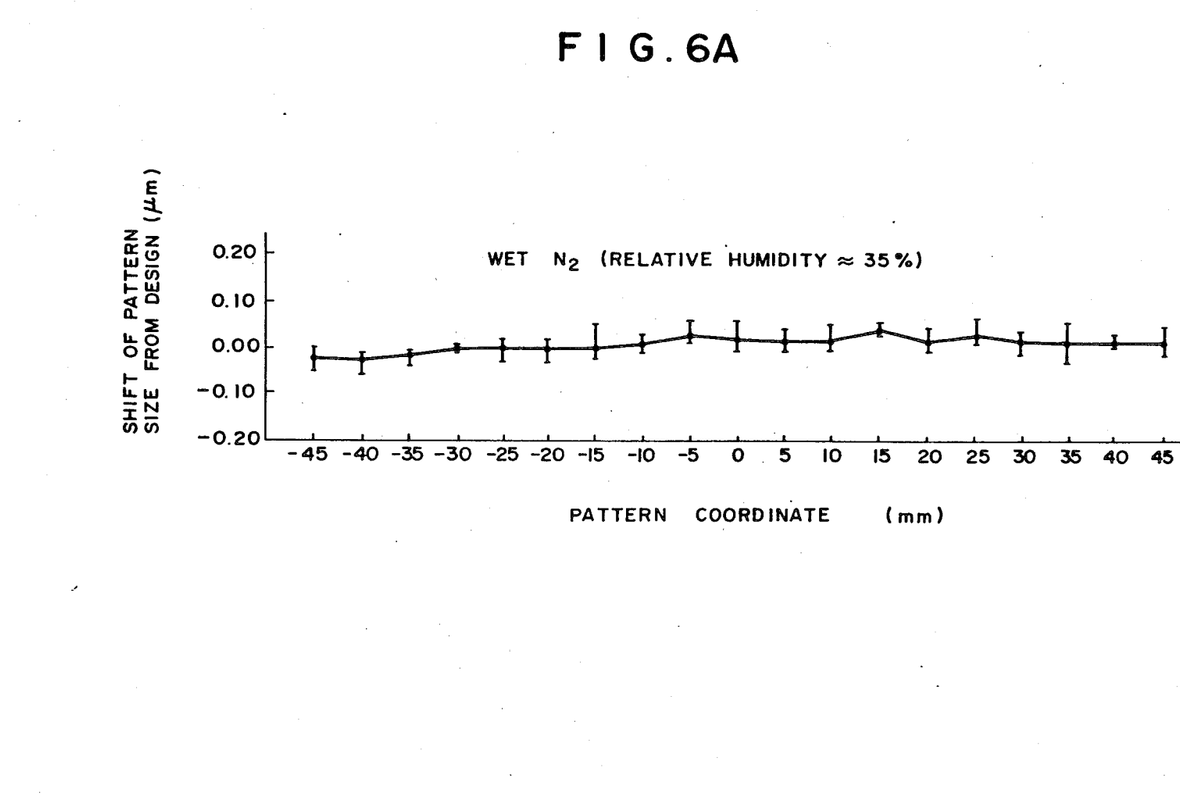
Figure 6B:
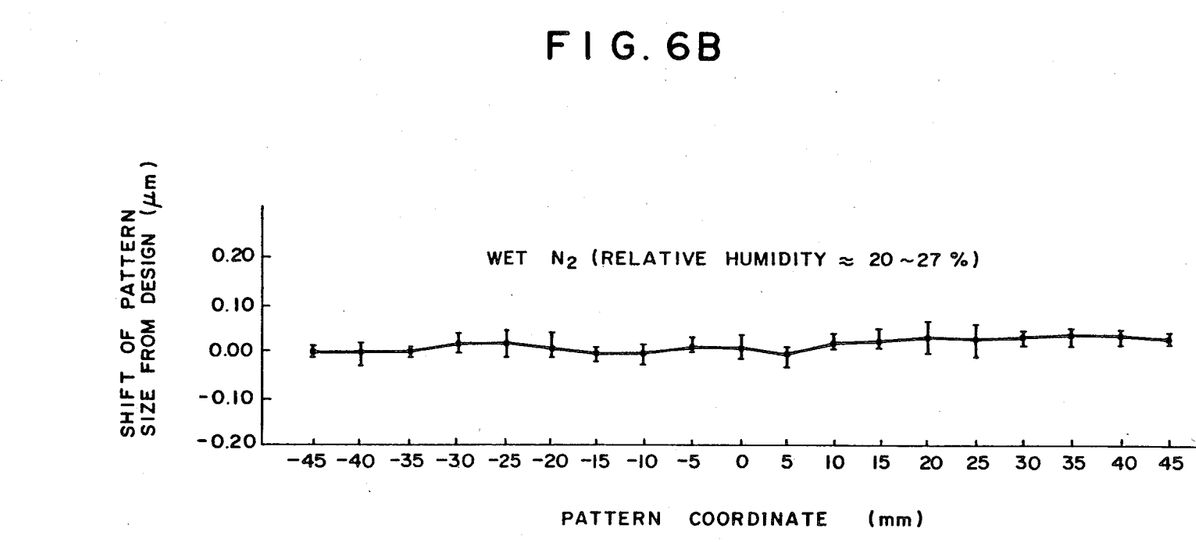
Figure 6C:
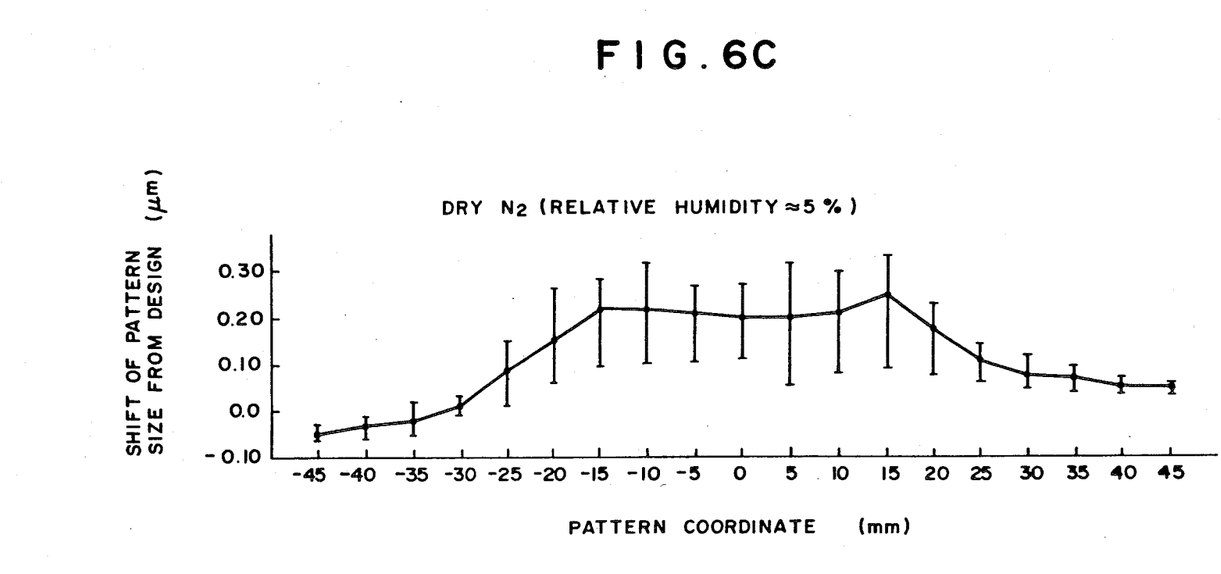

Nonuniformity of the pattern width has been checked by varying the humidity of $N_2$ gas. As can be seen in FIGS. 6A to 6C, for the relative humidity less than 5% the pattern size is not uniform; for the relative humidity more than 10% up to about 21-27% almost no irregularities are found; and for the relative humidity of about 35% the pattern size is found to be very stable. This result shows that it is important to keep the gas humidity at least at 10%. It should be noted here that the humidity mentioned above may vary to some extent as the $N_2$ gas temperature varies with variation of the ambient temperature of the exposing device. It should also be noted that for the different thickness of the photoresist (film thickness) conditions of the gas humidity and also the gas temperature may vary slightly.

As to the exposing device, the humidifier 16 is not limited to the construction described above but various kinds of humidifier such as spray type, atomizing type, dew point type and vaporizing type can be used.

Figure 7:
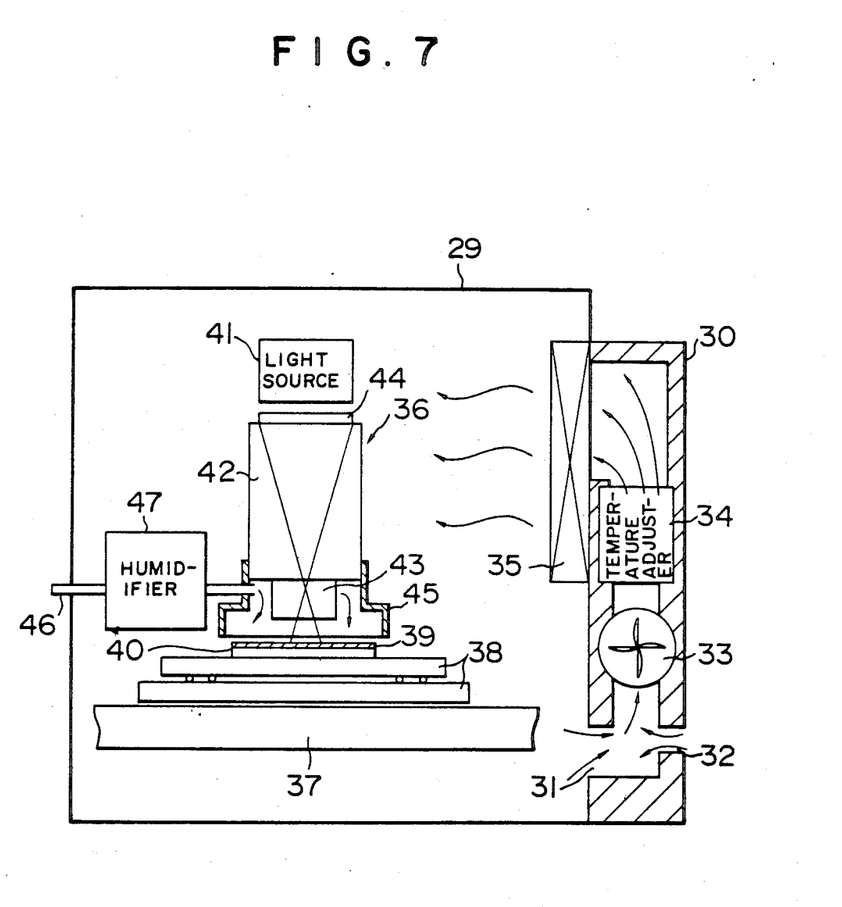
FIGS. 7 through 9 are schematic diagramatic views showing constructions of other embodiments of this invention.

FIG. 7 shows another embodiment of a reduction exposing device installed in a temperature-regulated room and not equipped with an air micrometer. This device has an air conditioner 30 to keep the temperature in the temperature-regulated room 29 at a predetermined temperature by circulating air in the room 29. The air conditioner 30 consists of a return air inlet 31, an external fresh air inlet 32, a fan 33, a temperature adjuster 34, and an air filter 35. The exposing machine 36 comprises a base table 37, an XY table 38 mounted on the base table 37, and an optical system including a light source 41, a barrel 42 and an objective lens 43 and capable of projecting a mask pattern on the mask 44 onto the photoresist 39 coated on the surface of a workpiece 40 such as a silicon wafer mounted on the XY table 38. Mounted on the lower end of the barrel 42 is a casing 45 enclosing the objective lens 43 and the workpiece 40, to which a piping 46 leading to an air source (not shown) is connected through a humidifier 47.

In the exposing device of this embodiment, the air which is controlled to a desired level of humidity by the humidifier 47 is blown from within the casing 45 to the entire surface of the photoresist 39 to keep the humidity of air near the photoresist surface at a specified value thus making the water content in the photoresist constant and uniform while the photoresist is being exposed. As in the preceding embodiment, this embodiment can also achieve uniformity in the pattern width. This embodiment is particularly effective for use in such devices as those which do not have air micrometers or in which the entire surface of photoresist is exposed at one time. Here, $N_2$ gas may be used instead of air for filling the space near the photoresist 39.

Figure 8:
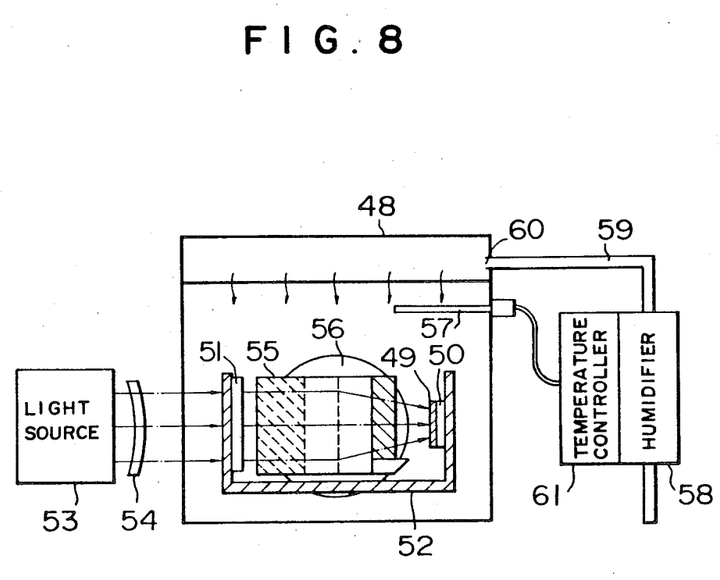

FIG. 8 shows an embodiment of a 1:1 (unit magnification) projection exposure device. The exposure device is partially contained in a temperature-controlled enclosure 48 which is disposed in a clean room, and comprises a holder 52, on the opposing sides of which are mounted a mask 51 and a workpiece 50 applied with a photoresist coating 49, and an optical system including a light source 53, a slit 54 formed of a thin glass prism serving for locally exposing the photoresist surface, an optical reflecting prism 55 and a reflecting mirror 56 and capable of projecting the mask pattern to the photoresist at a 1:1 scale. The temperature-controlled chamber 48 is provided with a temperature sensor 57 and an air inlet 60 connected with an air piping 59 in which a humidifier 58 is inserted. Based on the output from the temperature sensor 57, the temperature controller 61 provided to the humidifier 58 is controlled so as to regulate air to predetermined humidity and temperature and to supply the controlled air into the chamber 48. As a result, the air in the chamber and hence near the surface of the photoresist 49 is maintained at desired humidity and temperature and exposure is performed under these conditions.

Figure 9:
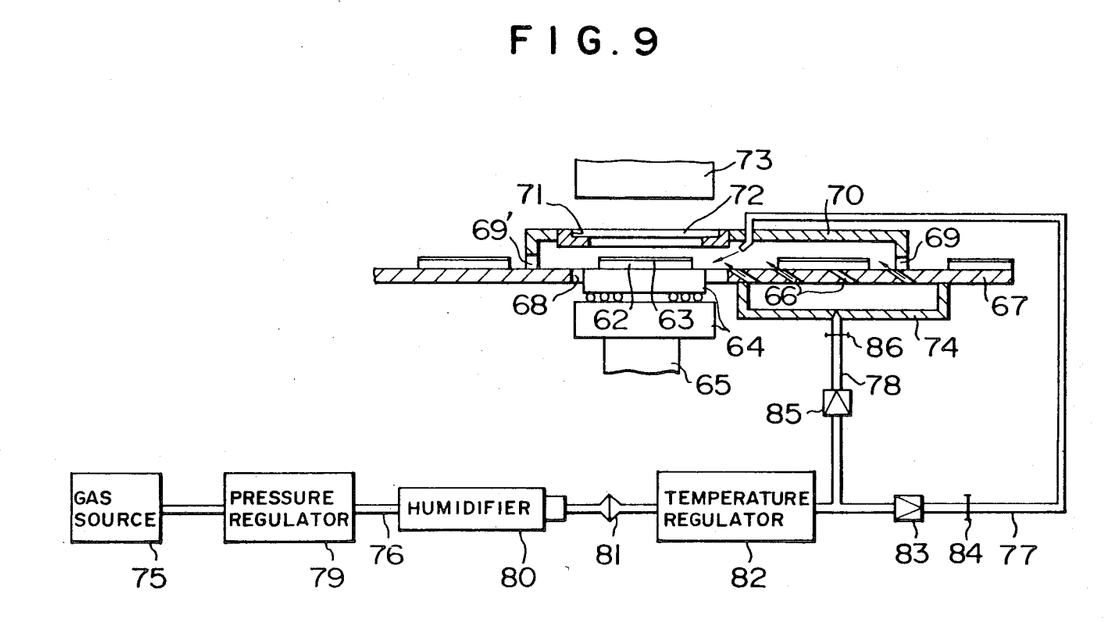

FIG. 9 shows another embodiment of an exposing device of contact type or proximity type. A wafer 62 as a workpiece has a film of photoresist 63 coated on it and is placed on the $XY\theta$ table 64 that can be moved in the XY directions as well as the $\theta$ direction. The $XY\theta$ table 64 is vertically movable by a lifting device 65. At the same level as the $XY\theta$ table 64, is disposed a table 67 which has slant nozzles 66 and an opening 68 through which the wafer 62 on the $XY\theta$ table is exposed. A casing 70 mounted on the table 67 has openings 69 and 69' for feeding and retrieving wafers therethrough and an opening 71, opposite to the $XY\theta$ table 64, in which a mask 72 is disposed. An illumination device 73 is disposed above the mask 72 for exposing the mask pattern to the photoresist 63 on the wafer 62. The position of the wafer with respect to the mask 72 is adjusted by the $XY\theta$ table 64 and the lifting device 65. Below the table 67 is provided an air pressure type wafer transferring device 74. A gas source 75 of the gas supply section is connected to the casing 70 and to the wafer transferring device 74 through pipes 76, 77 and 78 for the supply of gas. The pipe 76 is provided with a pressure regulator 79, a humidifier 80, a fine filter 81 and a temperature regulator 82 from the upstream in this order; the branch pipe 77 is provided with a valve 83 and a pressure switch 84 and another branch pipe 78 with a valve 85 and a pressure switch 86.

The pressurized dry air (or any other gas required for the process) from the gas source 75 having a relative humidity of 10% or less and containing no dust is supplied to the humidifier 80 through the pipe 76. In this process the pressure regulator 79 regulates the gage air pressure to 1.5 atm. In the humidifier 80 the pressurized air is controlled to the specified humidity and temperature suitable to the exposure of the photoresist 63. The air is further removed of dust or impurities by the fine filter 81 and is regulated by the temperature regulator 82 to a temperature equal to that of the photoresist. The valve 85 installed in the branch pipe 78 is effective to adjust the amount of pressurized air to be fed to the transferring device 4 which transfers wafers one after another onto the XY table 64 by the pressurized air blowing out of the nozzles 66. The branch pipe 77 also sends the humidity- and temperature-controlled pressurized air to the casing 70 by way of the valve 83. In this case, the air blowing out of the end of the branch pipe 77 into the casing 70 may be made to eject like shower. In an example of operation, a silicon wafer disposed on the right end of the table 67 is mechanically pushed through the opening 69 to the gas pressure type transferring device 74, then transferred by air pressure and guided by a mechanical stopper on the $XY\theta$ table 64, and exposed thereat. After the exposure, the exposed wafer is mechanically pushed through the opening 69' to another side of the table. The gas blown from the gas pressure type transferring device 74 fills the space between the mask 72 and the wafer 62 and exhausted through the opening 68, 69', etc.

As a result, the air around the photoresist is kept to the specified humidity and temperature, making water content of the photoresist constant and uniform, so that the width of the pattern can be made uniform. Since the transfer action of the wafer transferring device 74 is performed intermittently, the air flow to the transferring device 74 is supplied by the air pressure switch 86 only when the wafer is moved onto the $XY\theta$ table.

This invention is not limited to the embodiments described above and modifications or alterations can be made without departing from the spirit of this invention. While the above embodiments mainly concerns the exposure of mask pattern on the photoresist coated on silicon wafers, this invention can also be applied to the formation of secondary masks from a primary mask.

As can be seen from the foregoing, the method and apparatus of this invention for exposing photoresist have the advantage that since the gas ejected onto a photoresist is set within a certain range of humidity, and preferably in a desired range of temperature, to keep the water content of the photoresist films uniform when forming mask pattern in photoresist films, the photosensitivity of the photoresist film can be kept uniform and therefore the pattern width can be made uniform regardless of the difference in the position of the photoresist surface even when there exists a slight variation in the photoresist film thickness and in the amount of gas ejected onto the photoresist surface.

What is claimed is:

1. A method of exposing a photoresist coated on a workpiece to a fine device pattern on a mask or reticle by transferring the pattern onto the photoresist through an optical system including an objective lens, in an air-conditioned room, comprising the steps of:
   regulating the humidity of a gas to a value in a predetermined range, which humidity value is different from the humidity value of air in the air-conditioned room;
   blowing the gas locally into a space between said objective lens and said photoresist; and
   exposing the photoresist to the pattern;
   wherein said optical system includes a casing enclosing the objective lens and the photoresist and having a gas inlet.

2. A method of exposing a photoresist coated on a wafer to a pattern on a mask or a reticle by transferring the pattern on the wafer through an optical system located within an air-conditioned ambient atmosphere comprising the steps of:
   adjusting the humidity of a gas to a value predetermined range, which humidity value is different from that of the air-conditioned ambient atmosphere;
   blowing the gas onto the photoresist to detect the distance between the photoresist and the lens system;
   controlling the focus of said lens system; and
   exposing the photoresist surrounded by said humidified gas to the pattern.

3. A method of exposing the photoresist as set forth in claim 2, further comprising the step of heating the gas to a value in a predetermined range before the step of blowing the gas.

4. A method of exposing the photoresist as forth in claim 2, wherein said predetremined range of humidity is from about 10% to about 40%.

5. A method of exposing the photoresist as set forth in claim 2, wherein said gas is air or nitrogen.

6. A method of exposing a photoresist coated on a wafer to a fine device pattern on a mask or a reticle by transferring the pattern on the photoresist through an optical system located in an air-conditioned room, comprising the steps of:
   humidifying a dry gas to a humidity value in a predetermined range which is different from the humidity value of an air-conditioned ambient atmosphere;
   blowing the humidified gas into a space surrounding the wafer separately from the air-conditioned ambient atmosphere; and
   exposing the photoresist surrounded by said humidified dry gas to the pattern;
   wherein said step of humidifying the gas includes bubbling through deionized water and wherein said optical system includes an objective lens and a casing surrounding the objective lens and having an aperture in front of the photoresist and said step of blowing the gas includes blowing the gas the casing.

7. a method of exposing the photoresist as set forth in claim 6, wherein said optical system defines an optical path from the objective lens to the photoresist, and said casing has a gas inlet outside of the optical path and the aperture surrounding the optical path.

8. A method of exposing the photoresist as set forth in claim 6, wherein said aperture is small in area compared to the wafer and said step of exposing the photoresist exposes divided portions of the photoresist succesively.

9. A method of exposing a photoresist coated on a wafer to a fine device pattern on a mask or a reticle by transferring the pattern on the photoresist through an optical system located in an air-conditioned room, comprising the steps of:
   Humidifying a dry gas to a humidity value in a predetermined range which is diferent from the humidity value of an air-conditioned ambient atmosphere;
   blowing the humidified gas into a space surrounding the wafer separately from the air-conditioned ambient atmosphere, whereby a blown gas is provided in a space in front of the photoresist;
   detecting the pressure of said blown gas in said space in front of the photoresis;
   controlling the focus of the optical system based on the detected pressure; and
   exposing the photoresist surrounded by said humidified dry gas to the pattern.

10. A method of exposing a photoresist as set forth in claim 9, wherein the step of detecting the pressure includes detecting a pressure difference between the pressure of the blown gas and a reference gas pressure.

11. A method of exposing a photoresist as set forth in claim 10, further comprising the steps of:
    successively exposing different areas of the photoresist while blowing the gas onto the area being exposed.

12. A method of exposing a photoresist coated on a wafer to a fine device pattern on a mask or reticle by transferring the pattern onto the wafer through an optical system, comprising the steps of:
    setting the photoresist and the mask or reticle in an enclosure which contains the optical system and which is placed in a clean room having an air-conditioned ambient atmosphere;
    regulating the temperature and the humidity of a gas to respective values in predetermined ranges separately of that of said ambient atmosphere, the humidity value being different from the humidity of the air-conditioned ambient atmosphere;
    supplying the gas of regulated temperature and humidity into the enclosure; and
    exposing the photoresist surrounded by said gas to the pattern.

13. A method of exposing a photoresist coated on a workpiece to a fine device pattern on a mask or reticle in a step-and-repeat exposure system in an air-conditioned room, comprising the steps of:
    regulating the humidity of a gas to a value in a predetermined range, which value is different from the humidity of the air-conditioned ambient atmosphere;
    blowing the gas onto the photoresist;
    exposing the photoresist surrounded by said gas to the pattern; and
    successively shifting the position of the workpiece while keeping the humidity of the gas blowing onto the the photoresist constant;
    wherein said step of regulating the humidity includes humidifying a pressurized gas.

14. A method of exposing a photoresist coated on a workpiece successively to a plurality of fine device patterns optically transferred from a mask or a reticle in a step-and-repeat exposure system disposed in an air-conditioned room, comprising the steps of:
  regulating the humidity of a gas to a value in a predetermined range, which is different from the humidity of the air in said air-conditioned room;
  blowing the gas onto a selected part of the photoresist;
  positioning the workpiece and exposing the selected part of the photoresist on the workpiece to the pattern; and
  repeating the positioning and exposing step so that a substantial part of the photoresist is exposed to the plurality of the patterns, wherein the humidity of the gas is so selected that line widths of the patterns are uniform regardless of the position on the workpiece.

15. A method according to claim 14, wherein the step of regulating the humidity includes increasing the humidity of a dry gas.

16. A method according to claim 14, wherein the step of regulating the humidity includes bubbling a dry gas through water.

17. A method according to claim 16, wherein the step of bubbling includes bubbling through a porous layer immersed in water.

18. A method according to claim 15, where in the step of regulating the humidity further includes supplying a gas from a source of pressurized gas.

19. A method according to claim 18 wherein said source of pressurized gas is a pressurized nitrogen gas source.

20. A method according to claim 15, wherein the step of regulating the humidity further includes passing the gas, the humidity of which has been increased, through a trap for removing droplets.

21. A method according to claim 16, wherein the step of regulating the humidity includes controlling the temperature of the water to a selected value.

22. A method of exposing, in an air-conditioned room, a photoresist coated on a workpiece to a plurality of fine device patterns optically transferred from a mask or a reticle successively in a step-and-repeat exposure system which has an objective lens surrounded by a casing, which casing has a gas inlet and a gas outlet, the gas outlet facing the photoresist in a limited area, comprising the steps of:
  regulating the humidity of a gas to a value in a predetermined range, which is different from the humidity of the air in the air-conditioned room;
  blowing the gas into the casing through said gas inlet, thereby injecting the gas onto the surface of the photoresist below said gas outlet;
  translating the workpiece and locally exposing the photoresist in an area below said gas outlet to a fine device pattern, while blowing the gas into the casing; and
  repeating said translating and exposing step, wherein the humidity of the gas is so selected that the pattern has substantially uniform line width at the center and at the periphery of the workpiece.

* * * * *